(12) United States Patent
Otsuki et al.

(10) Patent No.: US 11,653,485 B2
(45) Date of Patent: May 16, 2023

(54) COMPONENT MOUNTING DEVICE

(71) Applicant: FUJI CORPORATION, Chiryu (JP)

(72) Inventors: Takahiro Otsuki, Chiryu (JP); Toshinori Shimizu, Kariya (JP)

(73) Assignee: FUJI CORPORATION, Chiryu (JP)

( * ) Notice: Subject to any disclaimer, the term of this patent is extended or adjusted under 35 U.S.C. 154(b) by 72 days.

(21) Appl. No.: 17/288,797

(22) PCT Filed: Nov. 21, 2018

(86) PCT No.: PCT/JP2018/042983
§ 371 (c)(1),
(2) Date: Apr. 26, 2021

(87) PCT Pub. No.: WO2020/105138
PCT Pub. Date: May 28, 2020

(65) Prior Publication Data
US 2022/0007558 A1  Jan. 6, 2022

(51) Int. Cl.
*H05K 13/04* (2006.01)
*H05K 13/08* (2006.01)

(52) U.S. Cl.
CPC ....... *H05K 13/0413* (2013.01); *H05K 13/082* (2018.08)

(58) Field of Classification Search
CPC ............. H05K 13/0413; H05K 13/082; H05K 13/0812
See application file for complete search history.

(56) References Cited

U.S. PATENT DOCUMENTS 5,780,866 A * 7/1998 Yamamura ........... G01N 21/956
  250/559.22
6,606,788 B1 * 8/2003 Morimoto .......... H05K 13/0813
  29/827

(Continued)

FOREIGN PATENT DOCUMENTS

CN  101317502 A  12/2008
CN  105532084 A   4/2016

(Continued)

OTHER PUBLICATIONS

International Search Report dated Feb. 26, 2019 in PCT/JP2018/042983 filed on Nov. 21, 2018, 2 pages.

*Primary Examiner* — Peter Dungba Vo
*Assistant Examiner* — Jose K Abraham
(74) *Attorney, Agent, or Firm* — Oblon, McClelland, Maier & Neustadt, L.L.P.

(57) ABSTRACT

A component mounting device moves a board height sensor horizontally to multiple measuring points and measures heights of the front surface of the board at the multiple measuring points. Subsequently, the component mounting device obtains a positional deviation in the horizontal direction of a target mounting position on the front surface of the board based on the heights of the front surface of the board so measured. In addition, the component mounting device obtains a positional deviation in a vertical direction of the target mounting position based on a measured height in the vertical direction of the front surface of the board. Then, the component mounting device corrects the target mounting position based on the positional deviation in the horizontal direction and the positional deviation in the vertical direction that are so obtained and mounts a component in the target mounting position so corrected.

4 Claims, 9 Drawing Sheets

(56) References Cited

U.S. PATENT DOCUMENTS

| | | | | |
|---|---|---|---|---|
| 2009/0125141 A1* | 5/2009 | Noda | ................ | H05K 13/0815 |
| | | | | 700/121 |
| 2012/0317804 A1* | 12/2012 | Endo | ................ | H05K 13/0452 |
| | | | | 29/703 |
| 2014/0132953 A1* | 5/2014 | Jeong | .................. | G01N 21/956 |
| | | | | 356/237.5 |
| 2016/0255754 A1* | 9/2016 | Takahira | ............ | H05K 13/0812 |
| | | | | 29/739 |

FOREIGN PATENT DOCUMENTS

| | | | | | |
|---|---|---|---|---|---|
| JP | 4467776 B2 * | 5/2010 | | | |
| JP | 2010-186940 A | 8/2010 | | | |
| JP | 2014-3153 A | 1/2014 | | | |
| JP | 6124900 B2 * | 3/2014 | ......... | G01B 11/0608 | |

* cited by examiner

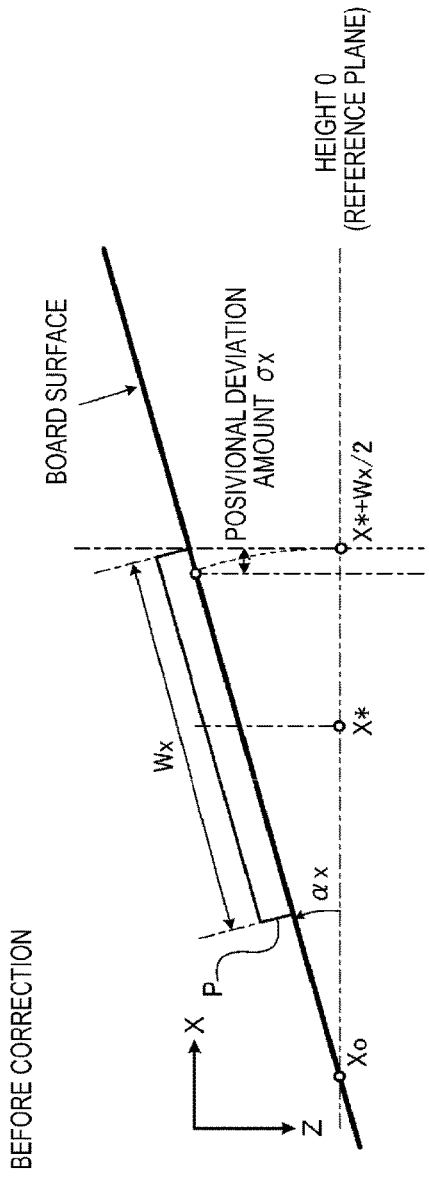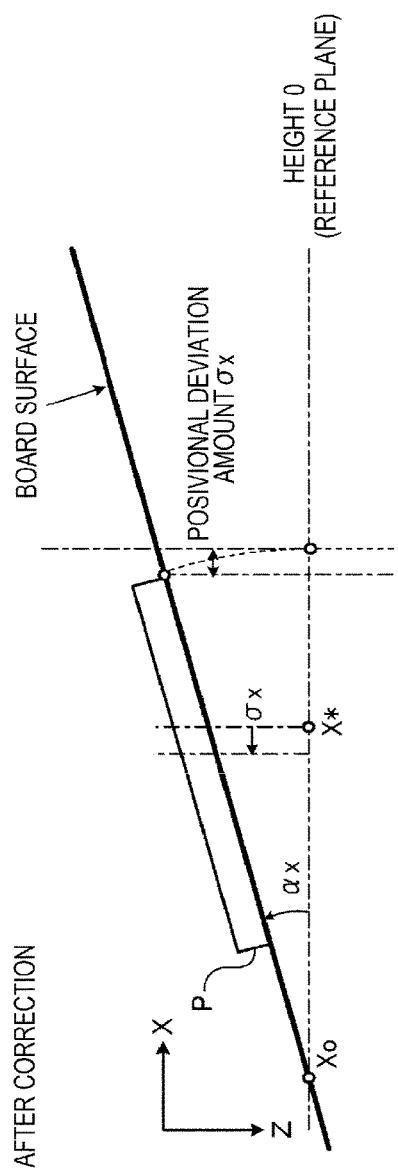

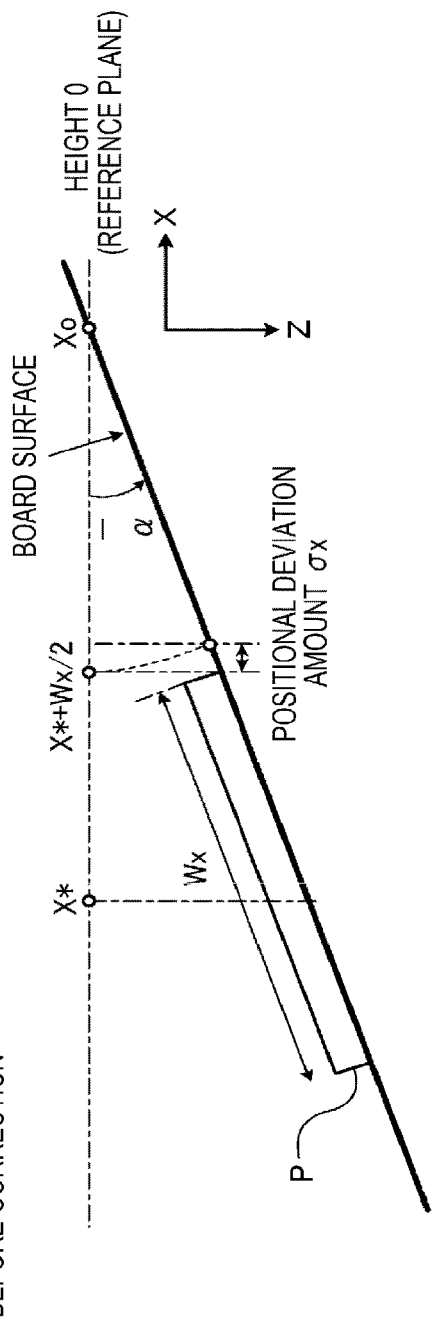
Fig. 10A  BEFORE CORRECTION
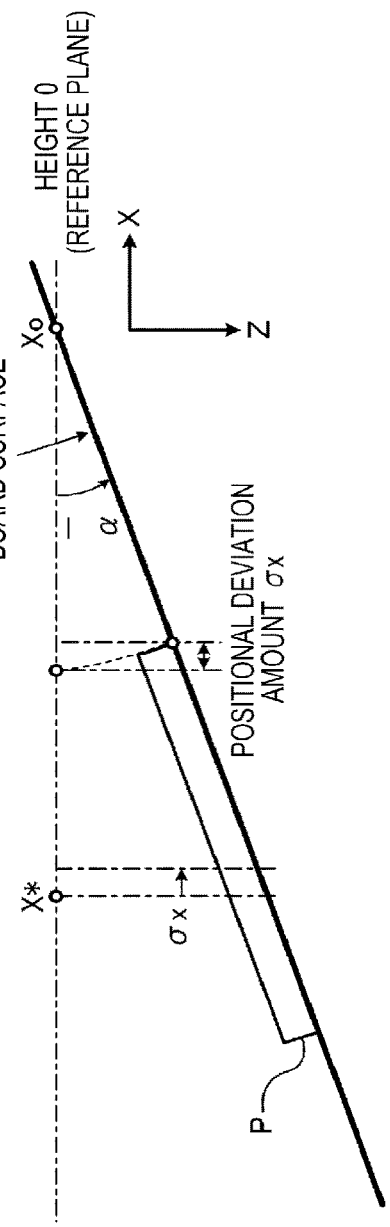
Fig. 10B  AFTER CORRECTION

COMPONENT MOUNTING DEVICE

TECHNICAL FIELD

The present description discloses a component mounting device.

BACKGROUND ART

Conventionally, there has been proposed a component mounting device in which an electronic component supplied by a component supply device is picked up by a suction nozzle provided on a head, and then, the component so picked up is conveyed to be mounted on a front surface of a board (for example, refer to Patent Literature 1). This component mounting device includes a laser sensor which is provided on the head, so that a height of a front surface of a board is measured by the laser sensor. Then, the component mounting device corrects the value of a mounting height based on the measured height of the front surface of the board, and mounts the component on the front surface of the board based on the corrected mounting height.

In addition, there has been proposed a component mounting device in which a warp height of a board is measured, a positional deviation amount in XY-directions (horizontal directions) of a mounting position is calculated from the measured warp height, and a movement amount of a head is corrected based on the calculated positional deviation amount so that a component is mounted in the mounting position on the board (for example, refer to Patent Literature 2). This component mounting device includes an angle sensor (a non-contact type optical sensor) which is disposed in a space defined between opposing board holding blocks of a board conveyance conveyor (on a back side of a board gripped by the board holding blocks). The component mounting device measures a warp height of a board by the angle sensor.

PATENT LITERATURE

Patent Literature 1: JP-A-2010-186940
Patent Literature 2: JP-A-2014-3153

BRIEF SUMMARY

Technical Problem

With the component mounting device described in Patent Literature 1, however, although the mounting height can be corrected, a positional deviation in a horizontal direction based on an inclination of the front surface of the board is not taken into consideration. In addition, with the component mounting device described in Patent Literature 2, since the warp of a board is estimated by the angle sensor (the non-contact type optical sensor) disposed on a back side of the board, the component mounting device cannot sufficiently deal with other forms of inclination such as a form in which unevenness is generated on the board or a form in which the board inclines in a uniform manner.

A main object of the present disclosure is to enable a more appropriate correction of a positional deviation of a component in a horizontal direction based on the inclination of a front surface of a board.

Solution to Problem

The present disclosure has taken the following means to achieve the main object thereof described above.

According to the gist of the present disclosure, there is provided a component mounting device for mounting a component on a front surface of a board which is conveyed by a board conveyance device, including:

a head having a holding member configured to hold a component;

a horizontal moving device configured to move the head in a horizontal direction relative to the front surface of the board;

a vertical moving device configured to move the holding member in a vertical direction relative to the front surface of the board;

a board height sensor provided movably in the horizontal direction by the horizontal moving device and configured to measure a height of the front surface of the board; and a control device configured to cause the horizontal moving device and the board height sensor to operate so as to enable the board height sensor to move horizontally to multiple measuring points to measure a height of the front surface of the board at each of the multiple measuring points, obtain an inclination of the front surface of the board based on the height of the front surface of the board measured at each of the multiple measuring points, obtain a positional deviation of a target mounting position on the front surface of the board in the horizontal direction based on the inclination of the front surface of the board so obtained and obtain a positional deviation of the target mounting position in the vertical direction based on the measured heights of the front surface of the board, correct the target mounting position based on the positional deviation in the horizontal direction so obtained and the positional deviation in the vertical direction so obtained, and cause the head, the horizontal moving device, and the vertical moving device to operate so as to mount the component in the target mounting position so corrected.

The component mounting device of the present disclosure includes the board height sensor that is provided movably in the horizontal direction by the horizontal moving device so as to measure a height of the front surface of the board. The control device of the component mounting device causes the board height sensor to move horizontally to the multiple measuring points to measure a height of a front surface of a board at each of the multiple measuring points. Subsequently, the control device obtains a positional deviation of the target mounting position on the front surface of the board in the horizontal direction based on the heights of the front surface of the board so measured. In addition, the control device obtains a positional deviation of the target mounting position in the vertical direction based on the measured heights of the front surface of the board in the vertical direction. Then, the control device corrects the target mounting position based on the positional deviation in the horizontal direction and the positional deviation in the vertical direction which are so obtained, and mounts the component in the target mounting position so corrected. In this way, since the component mounting device obtains an inclination of the front surface of the board by causing the board height sensor to move in the horizontal direction to measure a height of the front surface of the board at each of the multiple measuring points, even though the front surface of the board inclines in any way, the component mounting device can measure the inclination thereof accurately, whereby the component mounting device can correct more appropriately the positional deviation of the component in the horizontal direction based on the inclination of the front surface of the board.

BRIEF DESCRIPTION OF DRAWINGS

FIG. 9A is an explanatory diagram showing before correcting a positional deviation generated due to an inclination of a board.

FIG. 9B is an explanatory diagram showing after correcting a positional deviation generated due to an inclination of a board.

FIG. 10A is an explanatory diagram showing before correcting a positional deviation generated due to an inclination of a board.

FIG. 10B is an explanatory diagram showing after correcting a positional deviation generated due to an inclination of a board.

DESCRIPTION OF EMBODIMENTS

Next, an embodiment of the present disclosure will be described while referring to accompanying drawings.

Figure 1:
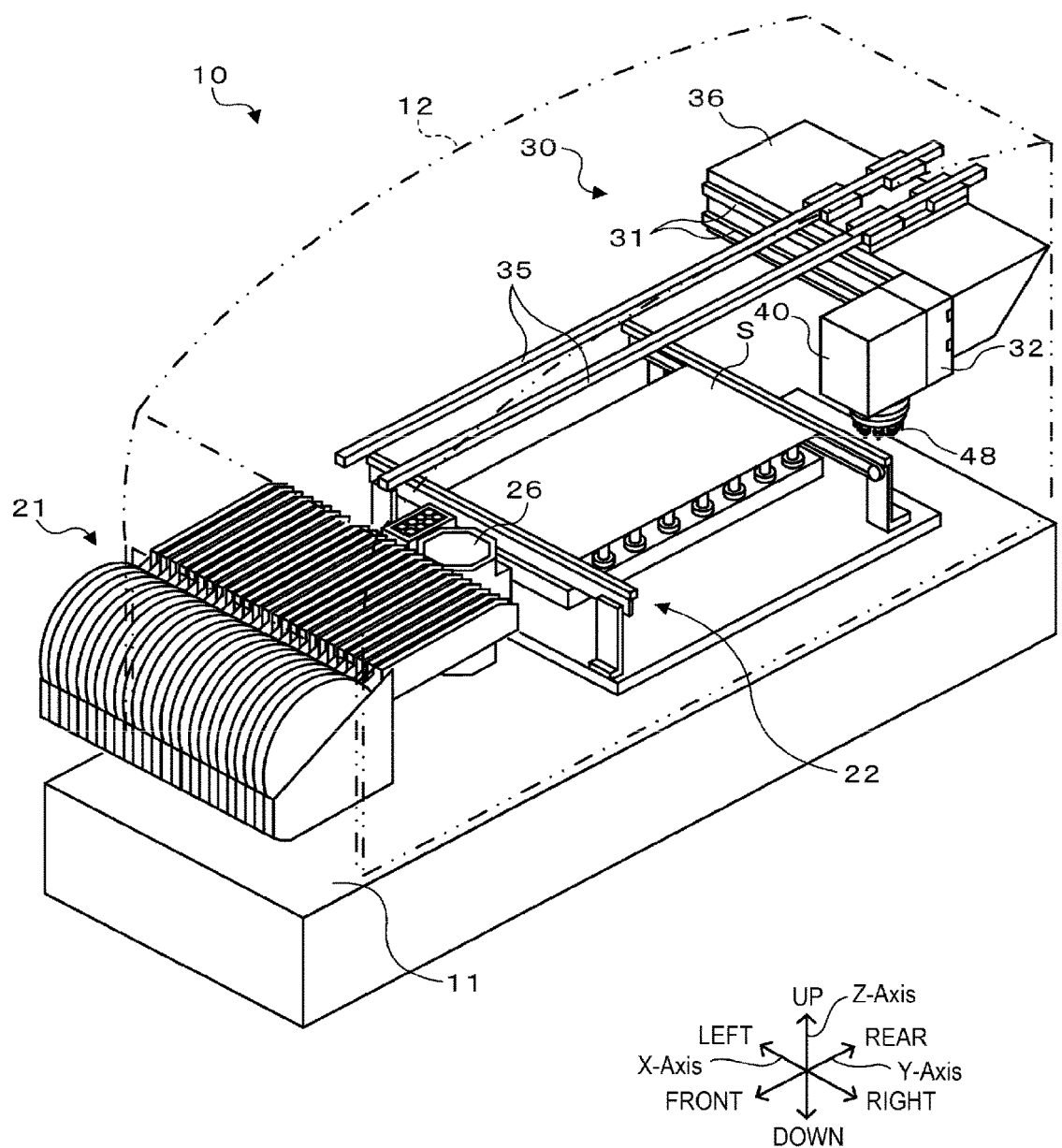
FIG. 1 is a schematic view showing schematically the configuration of component mounting device 10 of the present embodiment.
Figure 2:
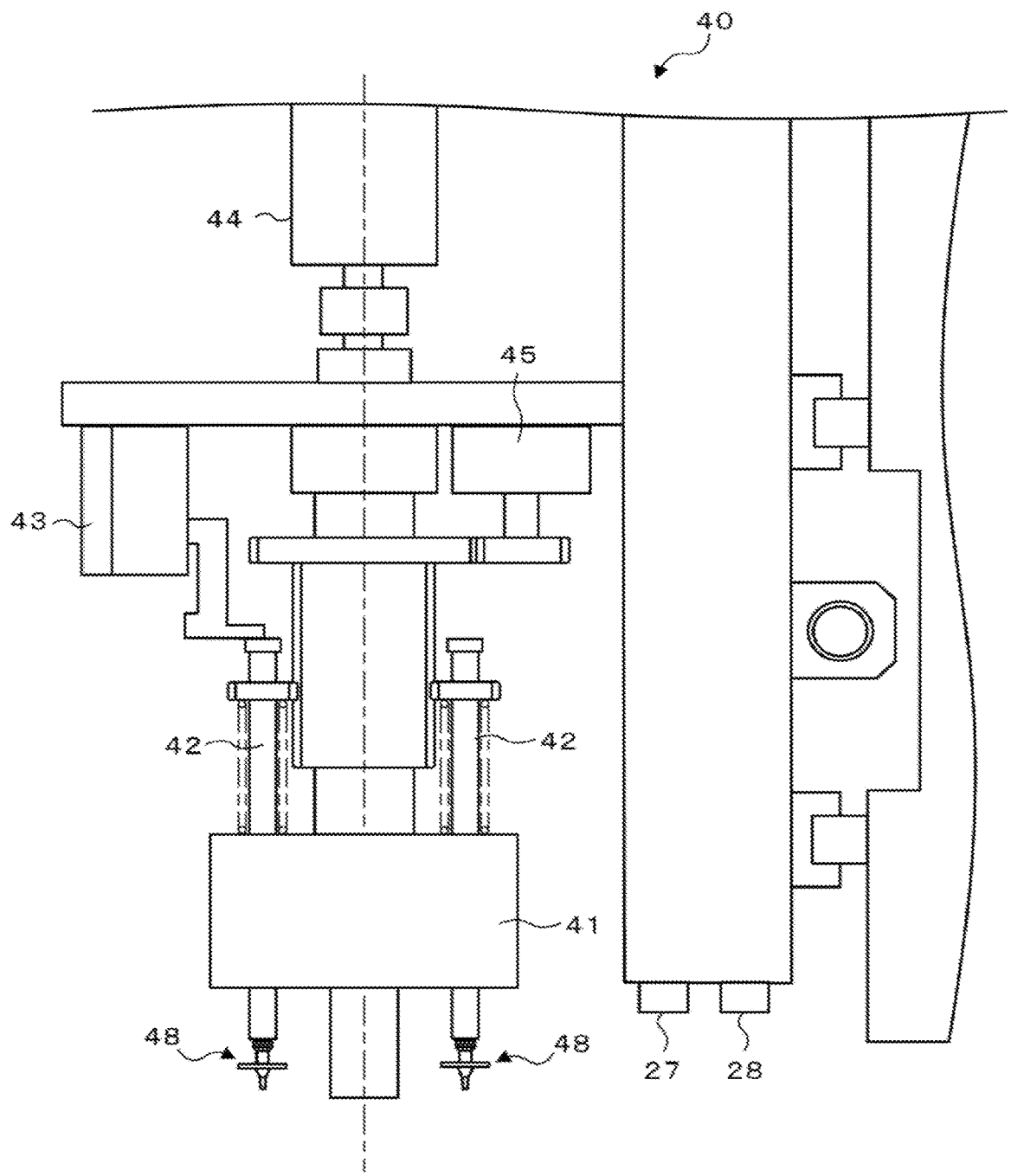
FIG. 2 is a schematic view showing schematically the configuration of head 40.
Figure 3:
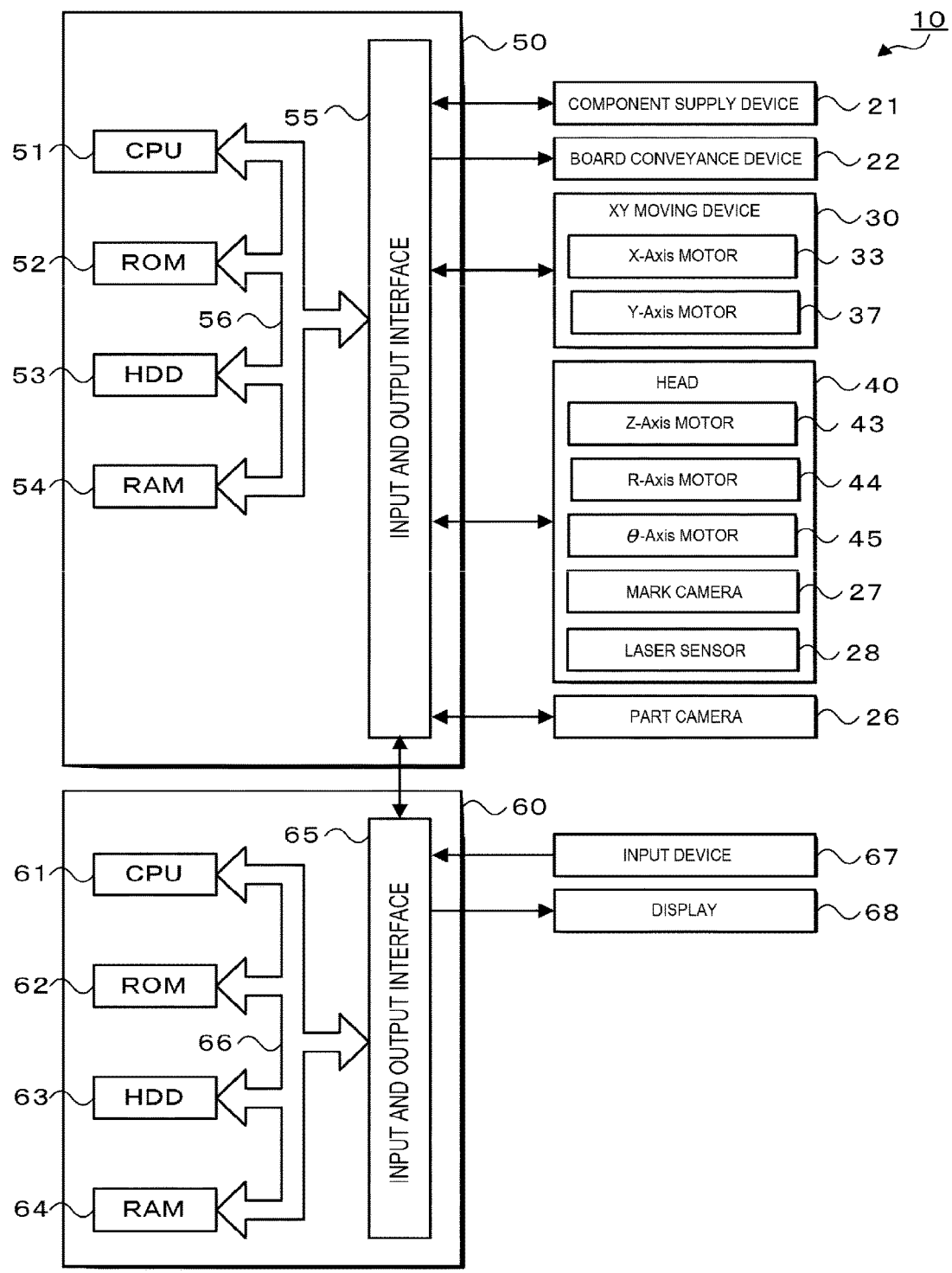
FIG. 3 is an explanatory diagram showing an electrical connection relationship of control device 50.

FIG. 1 is a schematic view showing schematically the configuration of component mounting device 10 of the present embodiment. FIG. 2 is a schematic view showing schematically the configuration of head 40. FIG. 3 is an explanatory diagram showing an electrical connection relationship of control device 50. In FIG. 1, a left-right direction denotes an X-axis direction, a front (a near side)-rear (a far side) direction denotes a Y-axis direction, and an up-down direction denotes a Z-axis direction.

As shown in FIG. 1, component mounting device 10 includes component supply device 21, board conveyance device 22, XY moving device 30, head 40, part camera 26, mark camera 27, laser sensor 28, and control device 50 (refer to FIG. 3).

Component supply device 21 supplies component P to a component supply position. Component supply device 21 is configured as a tape feeder for supplying component P to a component supply position by pulling out a tape in which components P are accommodated in accommodation sections which are formed at predetermined intervals from a reel and feeding the tape at a pitch. The tape feeder is detachably attached to each of multiple feeder stands which are provided at a front section of base 11 which supports housing 12 in such a manner as to be aligned in a left-right direction (an X-axis direction).

Board conveyance device 22 is provided on base 11 to be located from a central portion to a rear portion thereof and is designed to convey in, fix, and convey out a board S along the left-right direction (the X-axis direction) as seen in FIG. 1. Board conveyance device 22 has a pair of conveyor belts which is provided in such a manner as to be spaced apart from each other in the front-rear direction while being stretched in the left-right direction. Board S is conveyed by the conveyor belts.

As shown in FIG. 1, XY moving device 30 includes X-axis slider 32 and Y-axis slider 36. The X-axis slider 32 is supported by X-axis guide rail 31 provided on a front face of Y-axis slider 36 in such a manner as to extend in the left-right direction. X-axis slider 32 is movable in the left-right direction, that is, the X-axis direction by driving X-axis motor 33 (see FIG. 3). Y-axis slider 36 is supported by pair of left and right Y-axis guide rails 35 that is provided at an upper portion of housing 12 in such a manner as to extend in the front-rear direction. Y-axis slider 36 is movable in the front-rear direction, that is, the Y-axis direction by driving Y-axis motor 37. Head 40 is attached to X-axis slider 32. As a result, head 40 can be moved to any position on an XY-plane by XY moving device 30.

Head 40 picks up component P that is supplied to the component supply position and mounts component P so picked up onto board S. In the present embodiment, head 40 is a rotary head, and includes rotation body 41, nozzle holder 42, Z-axis motor 43, R-axis motor 44, and θ-axis motor 45, as illustrated in FIG. 2. As to nozzle holder 42, multiple nozzle holders 42 are arranged at equal intervals along an outer circumferential portion of rotation body 41 in such a manner as to be aligned in a circumferential direction, and can revolve along the circumferential direction as rotation body 41 rotates. Nozzle holders 42 are supported in such a manner as to move in the up-down direction (the Z-axis direction) with respect to rotation body 41. Suction nozzle 48 is detachably attached to a distal end portion of nozzle holder 42. Suction nozzle 48 is configured to pick up component P through suction using a negative pressure that is supplied to and discharged from a suction port. Z-axis motor 43 is, for example, a linear motor and is configured to lift up and lower nozzle holder 42 in multiple nozzle holders 42 that is located in a predetermined pivoting position. R-axis motor 44 is a motor for rotating rotation body 41. Multiple nozzle holders 42 are revolved or caused to walk around in the circumferential direction by R-axis motor 44. θ-axis motor 45 is a motor for pivoting or rotating each nozzle holder 42 on its own axis.

In addition, in the present embodiment, mark camera 27 and laser sensor 28 are provided on head 40. Mark camera 27 is configured to image a positioning reference mark affixed to board S from above. Laser sensor 28 is configured to measure a height of an upper surface of board S by shedding a laser beam onto the upper surface of that board S and measuring a reflection time therefrom. Mark camera 27 and laser sensor 28 are movable in the XY-directions by XY moving device 30.

Part camera 26 is provided between component supply device 21 and board conveyance device 22 on base 11 and is configured to image component P that is picked up by and held to suction nozzle 48 from below.

As shown in FIG. 3, control device 50 includes CPU 51, ROM 52, HDD 53, RAM 54, and input and output interface 55. These are electrically connected with one another via bus 56. Image signals from parts camera 26 and mark camera 27, detection signals from laser sensor 28, detection signals from position sensors for detecting positions of suction nozzles 48 in the X-direction, the Y-direction, and the Z-direction, and the like are inputted into control device 50 via input and output interface 55. On the other hand, control signals are outputted from control device 50 to component supply device 21, board conveyance device 22, XY moving device 30, head 40, and the like via input and output interface 55. Further, control device 50 is connected to management device 60 so as to enable a bidirectional communication therebetween, and data and control signals are exchanged between control device 50 and management device 60.

Management device 60 is, for example, a general-purpose computer, and includes CPU 61, ROM 62, HDD 63, RAM 64, input and output interface 65, and the like, as shown in FIG. 3. These are electrically connected with one another via bus 66. Input signals from input device 67 such as a mouse or a keyboard are inputted into management device 60 via input and output interface 65. Management device 60 outputs an image signal to display 68 via input and output interface 65. HDD 63 stores a production program of boards S. When referred to herein, the production program of boards S is a program which determines and describes types of components P to be mounted on board S and an order in which those components P are to be mounted on board S in a mounting process carried out by each component mounting device 10, the number of boards S so fitted with such components P that each component mounting device 10 is to produce in a production process, and the like.

Figure 4:
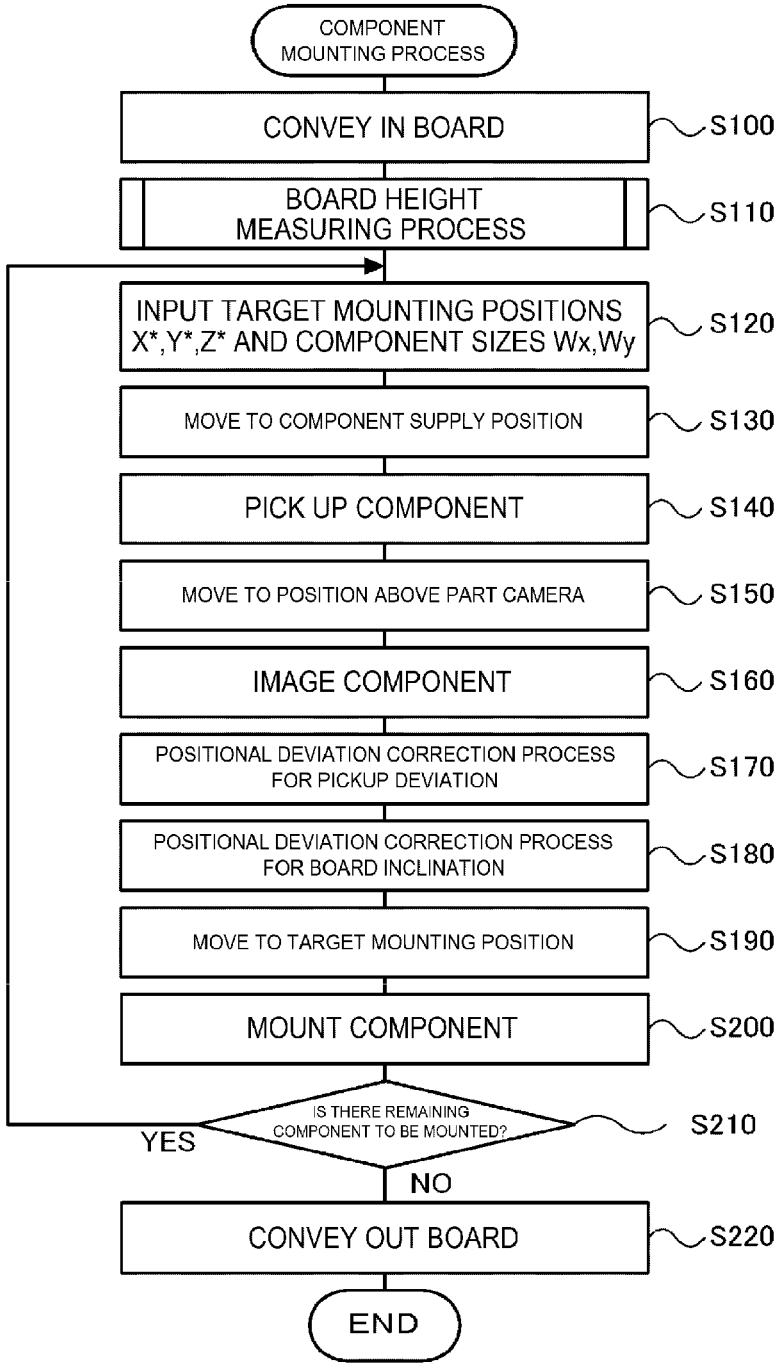
FIG. 4 is a flowchart showing an example of a component mounting process.

Next, an operation of component mounting device 10 of the present embodiment will be described which is configured as described heretofore. FIG. 4 is a flowchart showing an example of a component mounting process executed by control device 50. This component mounting process is executed when a production command is issued from management device 60 or the like.

Figure 5:
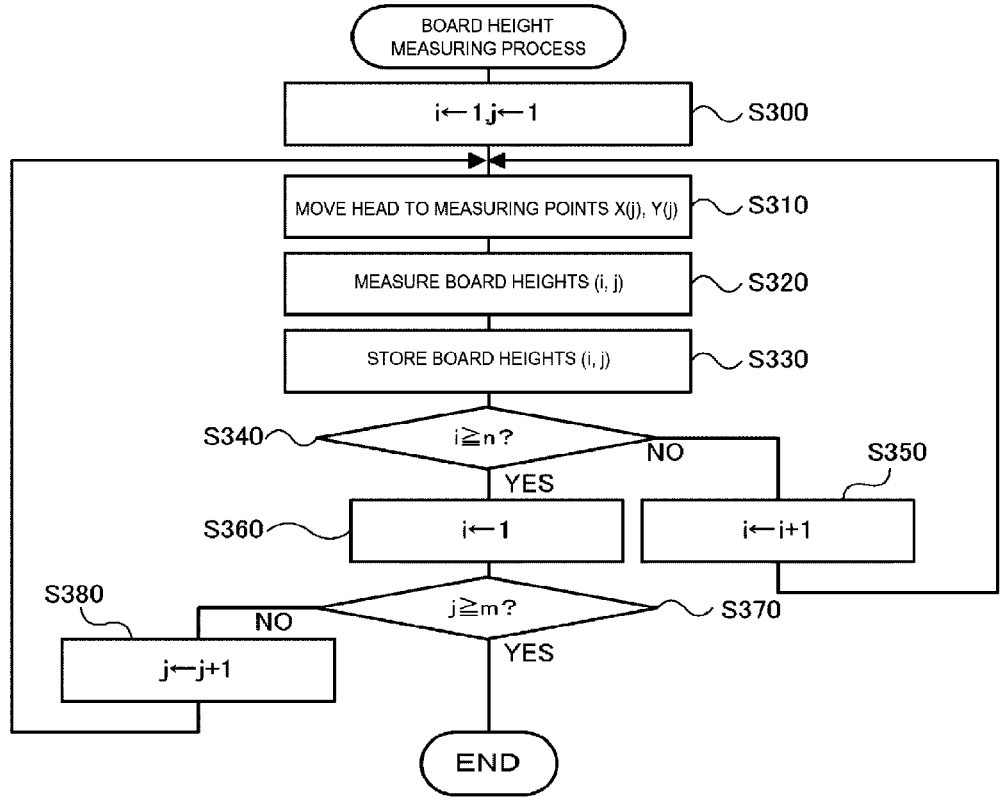
FIG. 5 is a flowchart showing an example of a board height measuring process.
Figure 6:
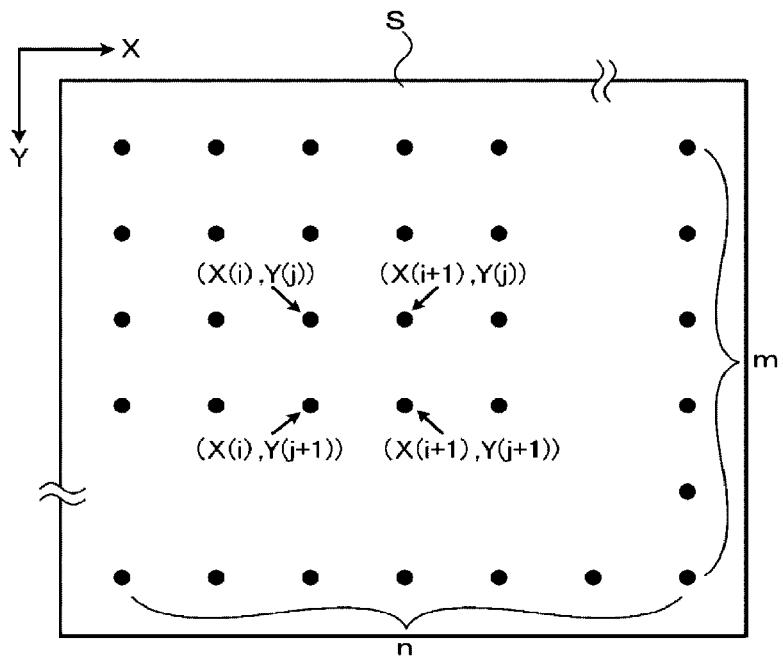
FIG. 6 is an explanatory diagram showing an example of multiple measuring points at which a board height is measured.

When the component mounting process is executed, CPU 51 of control device 50 first causes board conveyance device 22 to convey board S into component mounting device 10 and then measures a height of an upper surface of that board S so conveyed in (step S110). The measuring process in step S110 is carried out by executing a board height measuring process illustrated in FIG. 5. In the board height measuring process, CPU 51 first initializes both variables i, j to a value 1 (step S300). Subsequently, CPU 51 causes XY moving device 30 to move head 40 to measuring points X (i), Y (j) (step S310). Then, CPU 51 measures a board height h (i, j) at measuring points X (i), Y (j) by laser sensor 28 provided on head 40 (step S320), and causes RAM 54 to store the result of the measurement therein (step S330). Next, CPU 51 determines whether variable i is equal to or greater than a value n, which denotes the number of measuring points in the X-axis direction (step S340). If it determines that variable i is not equal to or greater than the value n, CPU 51 repeats a process of incrementing variable i by the value 1 (step S350), returning to step S310, and measuring a board height at a subsequent measuring point. On the other hand, if it determines that variable i is equal to or greater than the value n, CPU 51 initializes variable i to the value 1 (step S360), and determines whether variable j is equal to or greater than a value m, which denotes the number of measuring points in the Y-axis direction (step S370). If it determines that variable j is not equal to or greater than the value m, CPU 51 repeats a process of incrementing variable j by the value 1 (step S380), returning to step S310, and measuring a board height of a subsequent measuring point. On the other hand, if it determines that variable j is equal to or greater than the value m, determining that the measurement has been completed, CPU 51 ends the board height measuring process. The board height measuring process is carried out by determining measuring points X (i), Y (j) of n×m, which are arranged into a grid-like configuration as shown in FIG. 6, and measuring a board height at each of measuring points X (i), Y (j).

Returning to the component mounting process, CPU 51 inputs target mounting positions X*, Y*, Z* and component sizes Wx, Wy of component P to be mounted (step S120). Here, target mounting positions X*, Y*, Z* indicate target mounting positions in the X-axis direction (the left-right direction), the Y-axis direction (the front-rear direction), and the Z-axis direction (the up-down direction), respectively. In the present embodiment, component P is a component having a rectangular shape as seen from above. The component sizes Wx, Wy denote widths in the X-axis direction and the Y-axis direction, respectively. Then, it is understood that component P is mounted on board S in such a manner that a component center coincides with target mounting positions X*, Y*. CPU 51 causes XY moving device 30 to move head 40 (suction nozzle 48) to the component supply position (S130), causing that suction nozzle 48 so moved to pick up component P (step S140). Next, CPU 51 causes XY moving device 30 to move head 40 (suction nozzle 48) to a position above part camera 26 (step S150), and then causes part camera 26 to image component P picked up by and held to suction nozzle 48 (step S160). CPU 51 processes a captured image so obtained to recognize an actual pickup position, obtains positional deviation amounts in the X-axis direction and the Y-axis direction between the recognized pickup position and an ideal position, and corrects target mounting positions X*, Y* in the X-axis direction and the Y-axis direction, respectively, by offsetting the actual pickup position so recognized by amounts corresponding to the obtained positional deviation amounts in the same direction (step S170). Subsequently, CPU 51 further corrects target mounting positions X*, Y*, Z* in the X-axis direction, the Y-axis direction, and the Z-axis direction, respectively, based on the board heights measured at the multiple measuring points that are obtained in step S110 (step S180). Then, CPU 51 causes XY moving device 30 to move component P picked up by and held to suction nozzle 48 to a position above target mounting positions X*, Y*, and causes Z-axis motor 43 to mount that component P in target mounting position Z* (steps S190, S200). When it causes component P picked up by and held to suction nozzle 48 to be mounted on board S, CPU 51 determines whether there exists component P to be mounted subsequently (step S210). If it determines that there exists component P to be mounted on board S subsequently, CPU 51 returns to step S120 to repeat the process therein, whereas if it determines that there exists no component P to be mounted subsequently, CPU 51 causes board conveyance device 22 to convey board S out of component mounting device 10 (step S220), and ends the component mounting process.

Figure 7:
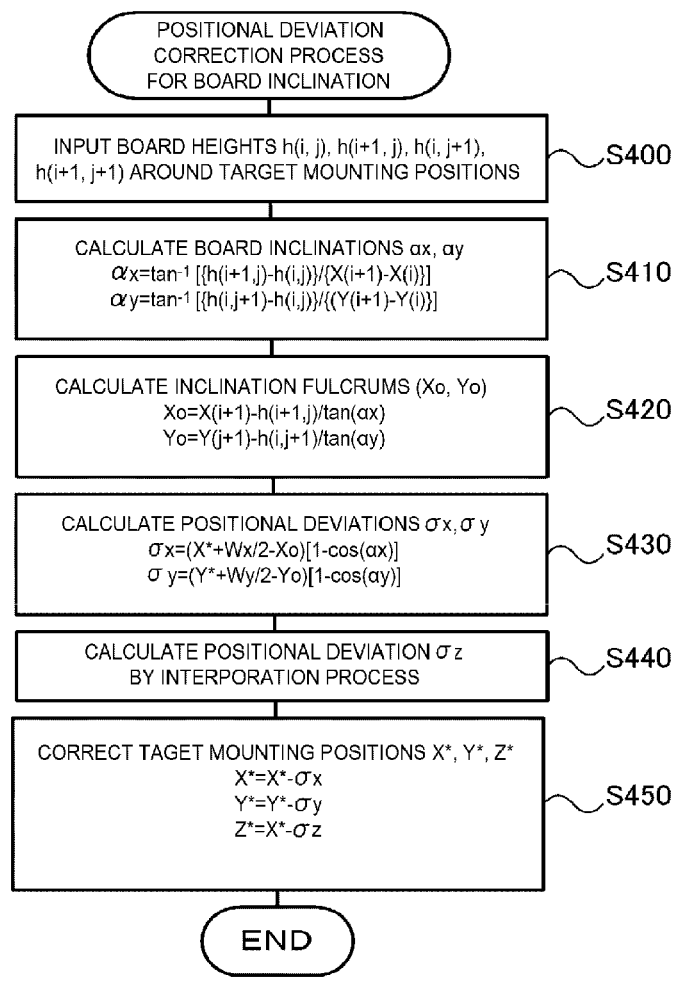
FIG. 7 is a flowchart showing an example of a positional deviation correction process of correcting a positional deviation generated due to an inclination of a board.
Figure 8:
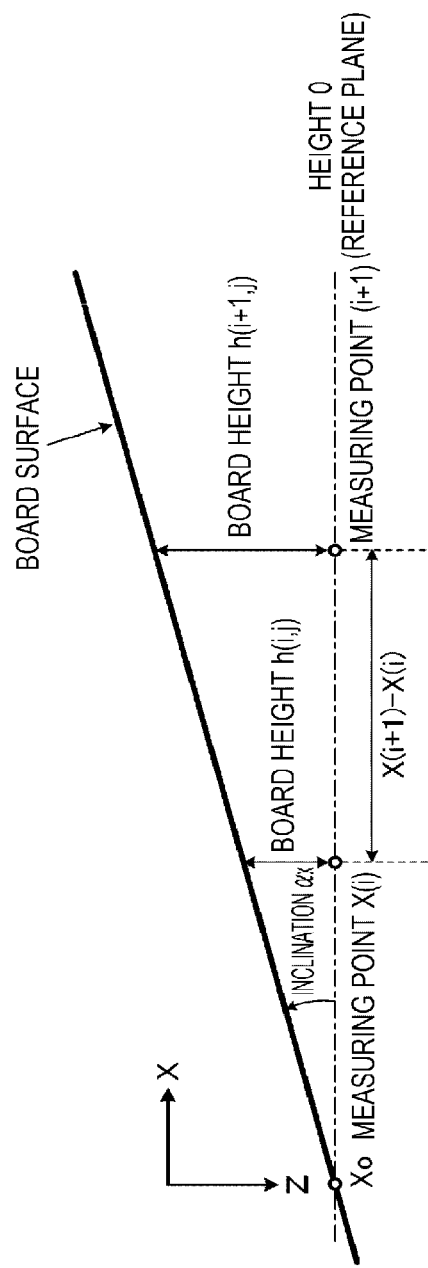
FIG. 8 is an explanatory diagram showing a relationship among an inclination α of a board, heights of the board at measuring points, and distances between the measuring points.

The process in step S180 is an executing a positional deviation correction process carried out due to an inclination of a board shown in FIG. 7. In the positional deviation correction process for the inclination of a board, CPU 51 first reads board heights h (i, j), h (i+1, j), h (i, j+1), h (i+1, j+1) at four points around target mounting positions X*, Y* from RAM 54 (step S400). Subsequently, CPU 51 calculates board inclinations αx, αy based on board heights h (i, j), h (i+1, j), h (i, j+1), h (i+1, j+1) so read (step S410). In the present embodiment, CPU 51 calculates board inclinations αx, αy using equations (1) and (2) below. Equation (1) can be derived from FIG. 8. Equation (2) can also be done similarly. CPU 51 may, for example, interpolate in the Y-axis direction each of board heights h (i, j), h (i, j+1) at two points on a left-hand side and board heights h (i+1, j), h (i+1, j+1) at two points on a right-hand side in the X-axis direction and calculate board inclination αx using two board heights so obtained. In addition, CPU 51 may, for example, interpolate in the X-axis direction each of board heights h (i, j), h (i+1, j) at two points on a front side and board heights h (i, j+1), h (i+1, j+1) at two points on a rear side in the Y-axis direction and calculate board inclination αy using two board heights so obtained.

$$\alpha x = \tan^{-1}[[h(i+1,j)-h(i,j)]/[(X(i+1)-X(i)]] \quad (1)$$

$$\alpha y = \tan^{-1}[[h(i,j+1)-h(i,j)]/[(Y(i+1)-Y(i)]] \quad (2)$$

Subsequently, CPU 51 calculates inclination fulcrums (Xo, Yo) that function as fulcrums of inclinations of board S in the X-axis direction and the Y-axis direction on a reference plane whose height is 0 (step S420). In the present embodiment, CPU 51 calculates inclination fulcrum Xo using equation (3) below. Equation (3) can be derived from FIG. 8. Inclination fulcrum Yo can also be calculated similarly.

$$Xo = X(i+1) - h(i+1,j)/\tan(\alpha x) \quad (3)$$

$$Yo = Y(j+1) - h(i,j+1)/\tan(\alpha y) \quad (4)$$

Then, CPU 51 calculates positional deviation amounts σx, σy in the X-axis direction and the Y-axis direction, respectively, when component P is mounted on board S in such a state that a front surface of that board S is inclined by σx in the X-axis direction and is inclined by σy in the Y-axis direction (step S440). Positional deviation amounts σx, σy can be calculated by equations (5), (6) below in the case that component P is mounted in such a manner that a component center coincides with target mounting positions X*, Y*. Positional deviation amount σx can be derived from FIG. 9(*a*). Positional deviation amount σy can also be done similarly.

$$\sigma x = (X^* + Wx/2 - Xo)[1 - \cos(\alpha x)] \quad (5)$$

$$\sigma y = (Y^* + Wy/2 - Yo)[1 - \cos(\alpha y)] \quad (6)$$

In addition, CPU 51 calculates positional deviation amount σz in the Z-axis direction based on those board heights h (i, j), h (i+1, j), h (i, j+1), h (i+1, j+1) at the four points around target mounting positions X*, Y* (step S440). CPU 51 can calculate positional deviation amount σz in the Z-axis direction by, for example, interpolating in the X-axis direction each of board heights h (i, j), h (i+1, j) at the two points on the front side and board heights h (i, j+1), h (i+1, j+1) at the two points on the rear side in the Y-axis direction and then interpolating further in the Y-axis direction using two board heights so obtained.

When it has calculated positional deviation amounts σx, σy, σz in the manner described heretofore, CPU 51 corrects target mounting positions X*, Y*, Z* that are obtained in step S170 to positions that are offset by amounts corresponding to positional deviation amounts σx, σy, σz so calculated in an opposite direction (step S450), and terminates the positional deviation correction process for the inclination of the board. The offset amounts of target mounting positions X*, Y*, Z* may be amounts that are obtained by multiplying positional deviation amounts σx, σy, σz by a coefficient that is greater than a value 0 and smaller than the value 1.

FIGS. 9 and 10 are explanatory diagrams showing how to correct a positional deviation due to an inclination of a board. In the present embodiment, component P is mounted in such a manner that a component center coincides with target mounting positions X*, Y*. At this time, in the X-axis direction, a left end portion of component P is positioned by one half component size Wx to the left from target mounting position X*. A right end portion of component P is positioned by one half component size Wx to the right from target mounting position X. Then, let's take into consideration a case in which component P is mounted on a front substrate surface of a board in such a state that the front surface of the board is inclined by inclination α about inclination fulcrum Xo in the X-axis direction. Component P is lowered in a posture parallel to the reference plane, and is mounted on target mounting positions X*, Y*, Z* on board S. As a result, as shown in FIG. 9(*a*), component P first comes into contact with board S at an intersection point between a perpendicular line extending upwards in the Z-axis direction in a position that is offset by one half component size Wx to the right from target mounting position X* and the front surface of that board S, and is then mounted on that board S. In this case, compared with a case in which board S is not inclined, component P is mounted in a position that deviates by positional deviation amount σx to the right in the X-axis direction. Consequently, as shown in FIG. 9(*b*), component mounting device 10 can suppress the occurrence of a mounting deviation (a mounting failure) by mounting component P in a position that is offset by positional deviation amount σx to the left in the X-axis direction. Subsequently, a case is taken into consideration in which component P is mounted on the front surface of board S in such a state that the front surface of board S is inclined by an inclination (−α) about inclination fulcrum Xo in the X-axis direction. In this case, as shown in FIG. 10(*a*), component P first comes into contact with board S at an intersection point between a perpendicular line extending downwards from the reference plane in the Z-axis direction in a position that is offset by one half component size Wx to the right from target mounting position X* and the front surface of that board S, and is then mounted on that board S. In this case, compared with a case in which board S is not inclined, component P is mounted in a position that deviates by positional deviation amount σx to the left in the X-axis direction. Consequently, as shown in FIG. 10(*b*), component mounting device 10 can suppress the occurrence of a mounting deviation (a mounting failure) by mounting component P in a position that is offset by positional deviation amount σx to the right in the X-axis direction. It should be noted that the same also applies to a case in which the front surface of the board is inclined with respect to the reference plane in the Y-axis direction. In the present embodiment, component mounting device 10 obtains inclination α of board S by providing laser sensor 28 on head 40 and measuring heights of board S at the multiple measuring points while moving head 40 in the XY directions. Then, component mounting device 10 corrects target mounting positions X*, Y* by obtaining positional deviation amounts σx, σy in the X-axis direction and the Y-axis direction, respectively, using equations (3) to (6) described above based on inclination α of board S obtained as described above. As a result, component mounting device 10 can suppress the positional deviations in the XY directions even though component P is mounted on board S in such a state that the front surface of board S is inclined, whereby component mounting device 10 can suppress the occurrence of a mounting deviation (a mounting failure). In addition, since component mounting device 10 corrects target mounting position Z* by the heights of board S that are measured by laser sensor 28, a sensor is not required which is configured exclusively to correct the positional deviations in the XY directions based on the inclination of board S.

Here, the correspondence between the principal elements of the present embodiment and principal elements of the present disclosure which are described in claims will be described. That is, board conveyance device 22 of the present embodiment corresponds to a board conveyance device of the present disclosure, suction nozzle 48 of the former corresponds to a holding member of the latter, head 40 of the former corresponds to a head of the latter, XY moving device 30 of the former corresponds to a horizontal moving device of the latter, Z-axis motor 43 of the former corresponds to a vertical moving device of the latter, laser sensor 28 of the former corresponds to a board height sensor of the latter, and control device 50 of the former corresponds to a control device of the latter.

Needless to say, the present disclosure is not limited to the present embodiment that has been described heretofore, and hence, the present disclosure can be carried out in various forms without departing from the technical scope of the present disclosure.

For example, in the present embodiment, component mounting device 10 is described such that the board height sensor (laser sensor 28) is provided on head 40 so as to measure heights of board S using the board height sensor while moving head 40 to the multiple measuring points. However, the board height sensor may be any sensor that is provided on, for example, X-axis slider 32 instead of head 40 so as to be moved in the XY directions by XY moving device 30.

In the present embodiment described heretofore, component mounting device 10 is described as using laser sensor 28 as the board height sensor. However, component mounting device 10 may use another optical sensor, a camera, or the like as the board height sensor. Alternatively, component mounting device 10 may use a contact sensor.

Thus, as has been described heretofore, according to the gist of the present disclosure, there is provided a component mounting device (10) for mounting a component on a front surface of a board which is conveyed by a board conveyance device (22), including a head (40) having a holding member (48) configured to hold a component, a horizontal moving device (30) configured to move the head (40) in a horizontal direction relative to the front surface of the board, a vertical moving device (43) configured to move the holding member (48) in a vertical direction relative to the front surface of the board, a board height sensor (28) provided movably in the horizontal direction by the horizontal moving device (30) and configured to measure a height of the front surface of the board, and a control device (50) configured to cause the horizontal moving device (30) and the board height sensor (28) to operate so as to enable the board height sensor (28) to move horizontally to multiple measuring points to measure a height of the front surface of the board at each of the multiple measuring points, obtain an inclination of the front surface of the board based on the height of the front surface of the board measured at each of the multiple measuring points, obtain a positional deviation of a target mounting position on the front surface of the board in the horizontal direction based on the inclination of the front surface of the board so obtained and obtain a positional deviation of the target mounting position in the vertical direction based on the measured heights of the front surface of the board, correct the target mounting position based on the positional deviation in the horizontal direction so obtained and the positional deviation in the vertical direction so obtained, and cause the head (40), the horizontal moving device (30), and the vertical moving device (43) to operate so as to mount the component in the target mounting position so corrected.

The component mounting device of the present disclosure includes the board height sensor that is provided movably in the horizontal direction by the horizontal moving device so as to measure heights of the front surface of the board. The control device of the component mounting device causes the board height sensor to move horizontally to the multiple measuring points to measure a height of a front surface of a board at each of the multiple measuring points. Subsequently, the control device obtains a positional deviation of the target mounting position on the front surface of the board in the horizontal direction based on the heights of the front surface of the board so measured. In addition, the control device obtains a positional deviation of the target mounting position in the vertical direction based on the measured heights of the front surface of the board in the vertical direction. Then, the control device corrects the target mounting position based on the positional deviation in the horizontal direction and the positional deviation in the vertical direction which are so obtained, and mounts the component in the target mounting position so corrected. In this way, since the component mounting device obtains an inclination of the front surface of the board by causing the board height sensor to move in the horizontal direction to measure a height of the front surface of the board at each of the multiple measuring points, even though the front surface of the board inclines in any way, the component mounting device can measure the inclination thereof accurately, whereby the component mounting device can correct more appropriately the positional deviation of the component in the horizontal direction based on the inclination of the front surface of the board.

In the component mounting device of the present disclosure that is configured in the way described above, assuming that an inclination of the front surface of the board is referred to as a and that a distance in the horizontal direction from the inclination fulcrum of the front surface of the board on the reference plane to the target mounting position is referred to as c, a positional deviation a in the horizontal direction of the front surface of the board may be such as to be calculated by σ=c·{1−cos(α)}. As a result, it is possible to suppress the occurrence of a mounting deviation due to the inclination of the front surface of the board by the simple process.

In the component mounting device of the present disclosure which takes the form described above, assuming that heights of the front surface of the board measured at the two measuring points are referred individually to as a, b, and that a distance in the horizontal direction between the two measuring points is referred to as c, the inclination α of the front surface of the board may be such as to be calculated by α=tan$^{-1}${(b−a)/c}. As a result, the inclination of the front surface of the board can be calculated by the simple process.

In the component mounting device of the present disclosure, the control device (50) may be such as to correct the target mounting position by offsetting it by an amount corresponding to the positional deviation in an opposite direction.

INDUSTRIAL APPLICABILITY

The present disclosure can be applied to a manufacturing industry of component mounting devices, and the like.

REFERENCE SIGNS LIST

10: component mounting device, 11: base, 12: housing, 21: component supply device, 22: component conveyance device, 26: part camera, 27: mark camera, 28: laser sensor, 30: XY moving device, 31: X-axis guide rail, 32: X-axis slider, 33: X-axis motor, 35: Y-axis guide rail, 36: Y-axis slider, 37: Y-axis motor, 40: head, 41: rotation body, 42: nozzle holder, 43: Z-axis motor, 44: R-axis motor, 45: θ-axis motor, 48: suction nozzle, 50: control device, 51: CPU, 52: ROM, 53: HDD, 54: RAM, 55: input/output interface, 56: bus; 60 management device, 61: CPU, 62: ROM, 63: HDD, 64: RAM, 65: input and output interface, 66: bus, 67: input device, 68: display, P: component, S: board

The invention claimed is:

1. A component mounting device for mounting a component on a front surface of a board which is conveyed by a board conveyance device, comprising:
   a head having a holding member configured to hold a component;
   a horizontal moving device including a horizontal slider configured to move the head in a horizontal direction relative to the front surface of the board;
   a vertical moving device including a vertical slider configured to move the holding member in a vertical direction relative to the front surface of the board;
   a board height sensor provided movably in the horizontal direction by the horizontal moving device and configured to measure a height of the front surface of the board; and
   processing circuitry configured to
      control the horizontal moving device to move the board height sensor horizontally to multiple measuring points to measure a height of the front surface of the board at each of the multiple measuring points,
      obtain a first inclination of the front surface of the board based on the height of the front surface of the board measured at at least two of the multiple measuring points in the horizontal direction,
      obtain a second inclination of the front surface of the board based on the height of the front surface of the board measured at at least two of the multiple measuring points in the vertical direction,
      obtain a first inclination fulcrum of the board in the horizontal direction based on the first inclination,
      obtain a second inclination fulcrum of the board in the horizontal direction based on the second inclination,
      obtain a positional deviation of a target mounting position on the front surface of the board in the horizontal direction with respect to the first fulcrum based on the first inclination of the front surface of the board and obtain a positional deviation of the target mounting position in the vertical direction based on the heights of the front surface of the board,
      correct the target mounting position based on the positional deviation in the horizontal direction so obtained and the positional deviation in the vertical direction so obtained, and
      cause the head, the horizontal moving device, and the vertical moving device to operate so as to mount the component in the target mounting position so corrected.

2. The component mounting device according to claim 1, wherein assuming that an inclination of the front surface of the board is referred to as a and that a distance in the horizontal direction from an inclination fulcrum of the front surface of the board on a reference plane to the target mounting position at a reference height is referred to as c, a positional deviation σ in the horizontal direction of the front surface of the board is calculated by $\sigma = c \cdot \{1 - \cos(\alpha)\}$.

3. The component mounting device according to claim 2, wherein assuming that heights of the front surface of the board measured at two measuring points are referred individually to as a, b, and that a distance in the horizontal direction between the two measuring points is referred to as c, the inclination α of the front surface of the board is calculated by $\alpha = \tan^{-1}\{(b-a)/c\}$.

4. The component mounting device according to claim 1, wherein the processing circuitry corrects the target mounting position by offsetting the target mounting position by an amount corresponding to the positional deviation.

* * * * *